(12) United States Patent
Uehira (10) Patent No.: US 9,362,323 B2
(45) Date of Patent: Jun. 7, 2016

(54) SOLID-STATE IMAGE SENSOR

(71) Applicant: CANON KABUSHIKI KAISHA, Tokyo (JP)

(72) Inventor: Kosei Uehira, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 19 days.

(21) Appl. No.: 14/533,312

(22) Filed: Nov. 5, 2014

(65) Prior Publication Data
US 2015/0130006 A1    May 14, 2015

(30) Foreign Application Priority Data

Nov. 13, 2013  (JP) ................................. 2013-235388

(51) Int. Cl.
*H01L 27/146* (2006.01)

(52) U.S. Cl.
CPC .... *H01L 27/14627* (2013.01); *H01L 27/14623* (2013.01); *H01L 27/14685* (2013.01)

(58) Field of Classification Search
CPC ................. H01L 27/14627; H01L 27/14623; H01L 27/14685
USPC ........................................................ 257/432
See application file for complete search history.

(56) References Cited

U.S. PATENT DOCUMENTS

| 5,900,655 | A | 5/1999 | Shim |
| 5,948,281 | A | 9/1999 | Okazaki et al. |
| 5,997,756 | A | 12/1999 | Okazaki et al. |
| 6,093,582 | A | 7/2000 | Shim |
| 6,163,407 | A | 12/2000 | Okazaki et al. |
| 8,686,337 | B2 | 4/2014 | Ogino et al. |
| 2002/0089596 | A1* | 7/2002 | Suda ..................... H04N 3/1593 348/302 |
| 2010/0207225 | A1* | 8/2010 | Masuda ....................... 257/432 |
| 2011/0073751 | A1 | 3/2011 | Ogino et al. |
| 2012/0043634 | A1* | 2/2012 | Kurihara ...................... 257/432 |
| 2014/0138523 | A1 | 5/2014 | Ogino et al. |

FOREIGN PATENT DOCUMENTS

| JP | H06-140609 A | 5/1994 |
| JP | H07-113983 A | 5/1995 |
| JP | H10-093060 A | 4/1998 |
| JP | H10-098173 A | 4/1998 |
| JP | H10-148704 A | 6/1998 |
| JP | H11-150254 A | 6/1999 |
| JP | 2000-164838 A | 6/2000 |
| JP | 2011-077175 A | 4/2011 |
| JP | 2012-134261 A | 7/2012 |

* cited by examiner

*Primary Examiner* — Karen Kusumakar
*Assistant Examiner* — Adam S Bowen
(74) *Attorney, Agent, or Firm* — Fitzpatrick, Cella, Harper & Scinto (57) ABSTRACT

An image sensor includes first to fourth microlenses. A first height difference between a first valley between the first and second microlenses and tops of the first and second microlenses is larger than a second height difference between a second valley between the third and fourth microlenses and tops of the third and fourth microlens, a first angle formed by a tangent in an outermost portion of the first microlens, which contacts the first valley and a plane perpendicular to the normal is equal to or smaller than a second angle formed by a tangent in an outermost portion of the third microlens, which contacts the second valley and the plane.

10 Claims, 9 Drawing Sheets

SOLID-STATE IMAGE SENSOR

BACKGROUND OF THE INVENTION

1. Field of the Invention

The present invention relates to a solid-state image sensor, a camera, and a method of manufacturing the solid-state image sensor.

2. Description of the Related Art

A solid-state image sensor includes a microlens to condense light to a photoelectric converter. The incident angle of light to an image sensing region is larger in the peripheral portion than in the central portion of the image sensing region. Therefore, the light condensing efficiency of light to the photoelectric converter by the microlens decreases more in the peripheral portion than in the central portion of the image sensing region. This can cause shading owing to the structure of the solid-state image sensor.

Japanese Patent Laid-Open No. 06-140609 describes that as a distance from the center of an imager unit increases, an amount of shifting an on-chip lens and an intermediate layer (color filter layer) corresponding to a light receiving unit to the center of the imager unit increases.

In general, the image sensing region of the solid-state image sensor is not a square but a rectangle having long sides and short sides. Therefore, shading in a direction along the long sides and shading in a direction along the short sides are different. Conventionally, however, a microlens array taking the difference between the shading in the direction along the long sides and the shading in the direction along the short sides into consideration has not been designed. That is, conventionally, the sectional shapes of the microlens along the long sides and the short sides are the same.

SUMMARY OF THE INVENTION

The present invention provides a technique advantageous in reducing shading in a direction along the long sides of an image sensing region of a rectangle having the long sides and the short sides.

One of aspects of the present invention provides a solid-state image sensor comprising a semiconductor substrate including a plurality of photoelectric converters arrayed to form an image sensing region of a rectangle having long sides and short sides, and a plurality of microlenses corresponding to the plurality of photoelectric converters, the plurality of microlenses including a first microlens, a second microlens, a third microlens, and a fourth microlens; wherein a first height difference between a first valley and a top of each of the first microlens and the second microlens is larger than a second height difference between a second valley and a top of each of the third microlens and the fourth microlens, the first valley arranged between the first microlens and the second microlens adjacent to each other in a first direction along the long side, and the second valley arranged between the third microlens and the fourth microlens adjacent to each other in a second direction along the short side, and a first angle formed by, out of a surface of the first microlens in a section passing through a center of each of the first microlens and the second microlens and parallel to a normal of a surface of the semiconductor substrate, a tangent in an outermost portion which contacts the first valley and a plane perpendicular to the normal is equal to or smaller than a second angle formed by, out of a surface of the third microlens in a section passing through a center of each of the third microlens and the fourth microlens and parallel to the normal, a tangent in an outermost portion which contacts the second valley and the plane perpendicular to the normal.

Further features of the present invention will become apparent from the following description of exemplary embodiments with reference to the attached drawings.

DESCRIPTION OF THE EMBODIMENTS

The present invention will be described below through its illustrative embodiments with reference to the accompanying drawings.

Figure 1:
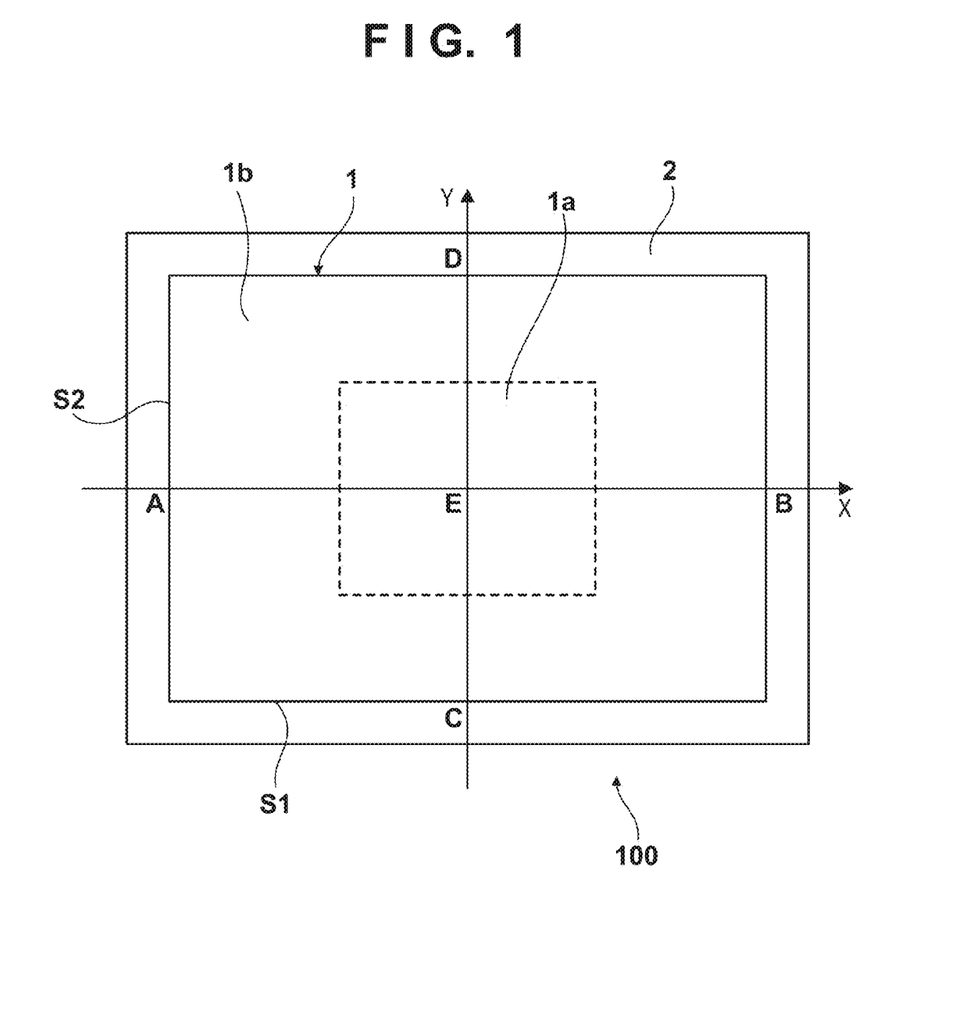
FIG. 1 is a schematic view showing the arrangement of a solid-state image sensor according to one embodiment of the present invention.

As illustrated in FIG. 1, a solid-state image sensor 100 according to one embodiment of the present invention has an image sensing region 1 and a peripheral circuit region 2. The image sensing region 1 has the shape of a rectangle including a long side S1 and a short side S2. Assume that a direction along the long side S1 is an X direction (first direction) and a direction along the short side S2 is a Y direction (second direction). Also assume that a direction orthogonal to the X direction and the Y direction is a Z direction.

The image sensing region 1 has a plurality of pixels to form a plurality of rows and a plurality of columns. Each pixel has a photoelectric converter. Each photoelectric converter is formed on a semiconductor substrate. The peripheral circuit region 2 can include, for example, a row selecting circuit for selecting a row in the image sensing region 1 and a readout circuit for reading out signals from the plurality of pixels in the row selected by the row selecting circuit. The peripheral circuit region 2 can include a column selecting circuit for sequentially selecting the signal of one pixel from the signals of the plurality of pixels read out by the readout circuit. The image sensing region 1 has a central portion 1a and a peripheral portion 1b surrounding the central portion 1a.

Figure 2A:
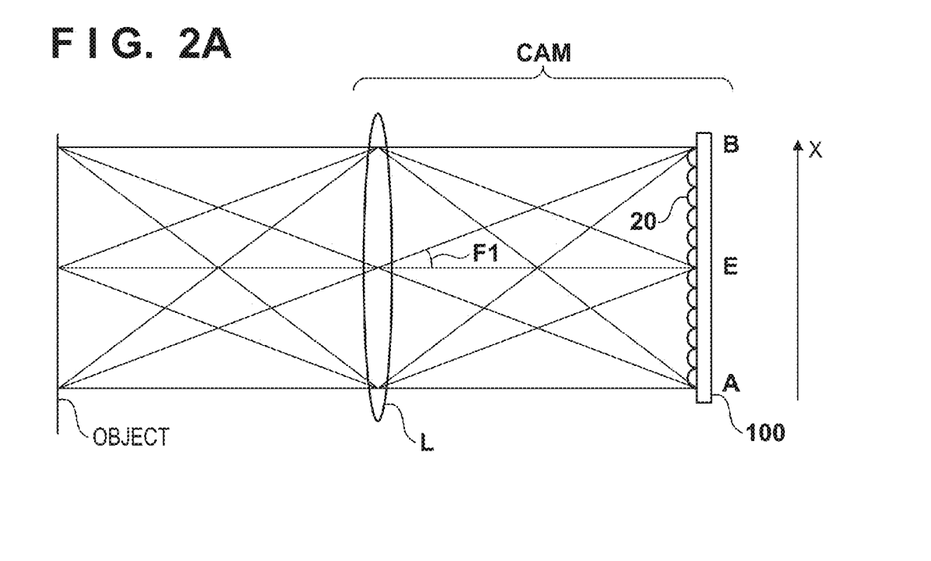
FIGS. 2A and 2B are schematic views showing a camera including the solid-state image sensor.
Figure 2B:
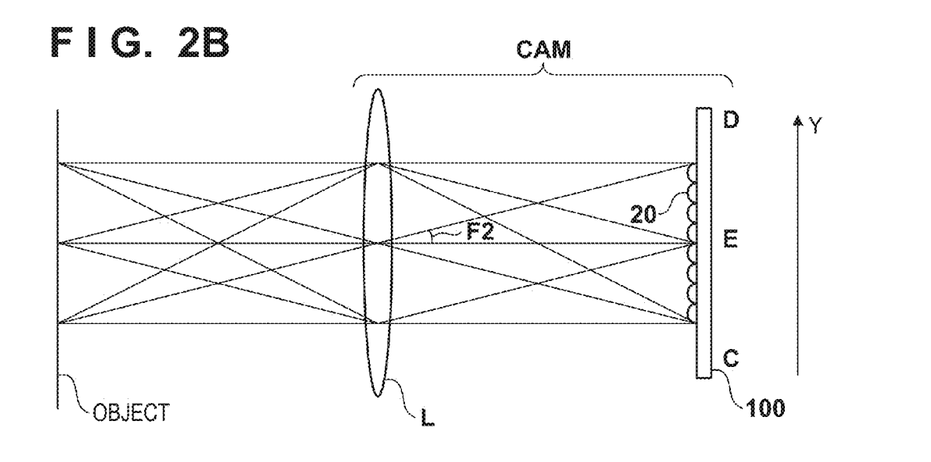

FIGS. 2A and 2B schematically show a camera CAM including the solid-state image sensor 100. The camera CAM includes a lens L which forms the image of an object in the image sensing region 1 of the solid-state image sensor 100. FIG. 2A is a sectional view in a direction along the long side S1 of the image sensing region 1, that is the X direction (first direction). FIG. 2B is a sectional view in a direction along the short side S2 of the image sensing region 1, that is the Y direction (second direction).

The incident angle of light entering microlenses 20 increases with an increase in distance from the center of the image sensing region 1 (the optical axis of the lens L). The incident angle of a light ray to a microlens at the outermost position (that is, the microlens 20 adjacent to the short side S2) out of the microlenses arrayed along the long side S1 (X direction (first direction)) of the image sensing region 1 is defined as F1. On the other hand, the incident angle of a light ray to a microlens at the outermost position (that is, the microlens 20 adjacent to the long side S1) out of the microlenses arrayed along the short side S2 (Y direction (second direction)) of the image sensing region 1 is defined as F2. Under these definitions, the relationship of F1>F2 holds.

Figure 3A:
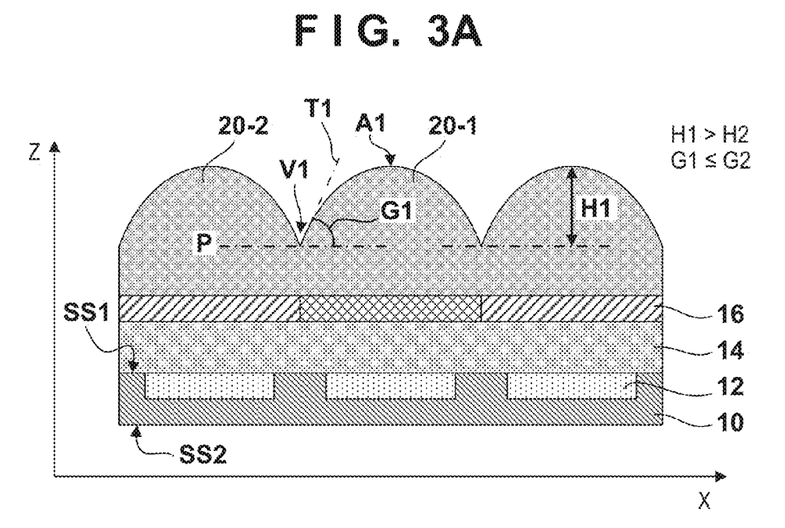
FIGS. 3A and 3B are partial sectional views showing the solid-state image sensor.
Figure 3B:
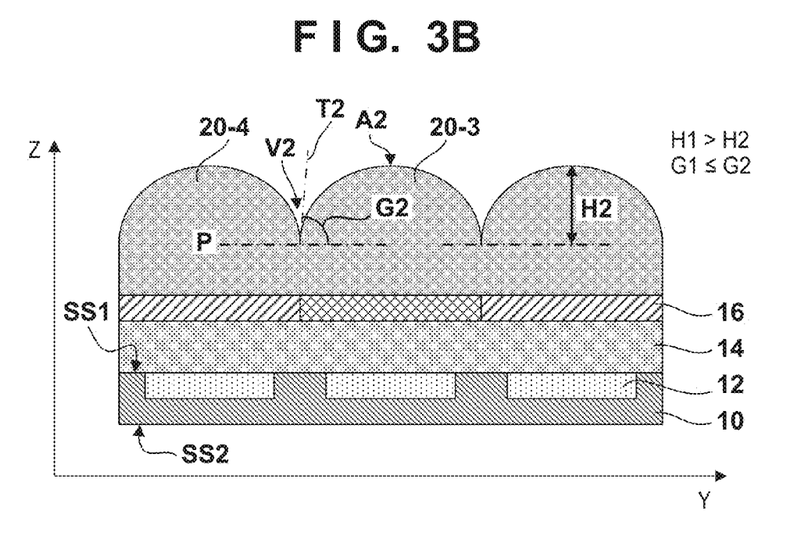

FIG. 3A is a sectional view showing a part of a section obtained by cutting the solid-state image sensor 100 in a direction along the long side S1 (X direction (first direction)) of the image sensing region 1. FIG. 3B is a sectional view showing a part of a section obtained by cutting the solid-state image sensor 100 in a direction along the short side S2 (Y direction (second direction)) of the image sensing region 1. In an example shown in FIGS. 3A and 3B, the solid-state image sensor 100 is formed as a back illumination solid-state image sensor. That is, in the example shown in FIGS. 3A and 3B, a semiconductor substrate 10 includes a first surface SS1 and a second surface SS2, the plurality of microlenses 20 are arranged on the side of the first surface SS1 of the semiconductor substrate 10, and a wiring structure (not shown) is arranged on the side of the second surface SS2 of the semiconductor substrate 10. Note that the present invention can be formed as a solid-state image sensor (front illumination solid-state image sensor) in which the plurality of microlenses 20 are arranged on the side of the first surface SS1 of the semiconductor substrate 10, and the wiring structure is arranged between the first surface SS1 of the semiconductor substrate 10 and the microlenses 20.

The solid-state image sensor 100 includes the semiconductor substrate 10 having a plurality of photoelectric converters 12 arrayed to form the image sensing region 1, and the plurality of microlenses 20 (20-1, 20-2, 20-3, and 20-4) corresponding to the plurality of photoelectric converters 12. Reference numerals 20-1, 20-2, 20-3, and 20-4 are used, for the descriptive convenience, to distinguish the plurality of microlenses 20 from each other. The solid-state image sensor 100 can include an insulating layer 14 and/or a color filter layer 16 between the plurality of microlenses 20 and the semiconductor substrate 10. The plurality of microlenses 20 are in contact with each other and arranged without any gaps, that is, without exposing the underlying layer of the plurality of microlenses 20. Each pixel including the photoelectric converter 12 can have a square shape. In other words, the photoelectric converters 12 can be arrayed such that the arrangement pitch of the photoelectric converters 12 in the X direction (first direction) and that in the Y direction (second direction) are equal to each other. Out of the plurality of microlenses 20, the microlenses other than the microlenses which form the outermost portion of an array made of the plurality of microlenses 20 have the same shape. The microlenses provided in the outermost portion have different shapes because they have fewer adjacent microlenses than other microlenses.

Out of the plurality of microlenses 20, a first valley V1 between the first microlens 20-1 and the second microlens 20-2 adjacent to each other in the X direction (first direction) along the long side S1 and a top A1 of each of the first microlens 20-1 and the second microlens 20-2 have a first height difference H1. Out of the plurality of microlenses 20, a second valley V2 between the third microlens 20-3 and the fourth microlens 20-4 adjacent to each other in the Y direction (second direction) along the short side S2 and a top A2 of each of the third microlens 20-3 and the fourth microlens 20-4 have a second height difference H2. In this embodiment, H1>H2 is satisfied. This corresponds to making the power of the microlenses 20 in the X direction larger than that in the Y direction, and is advantageous in condensing a light ray having the incident angle F1 which is larger than the incident angle F2 (that is, a light ray having the large incident angle) to the photoelectric converters 12.

The section shown in FIG. 3A is a section which passes through the center of each of the first microlens 20-1 and the second microlens 20-2 adjacent to each other in the X direction (first direction), and is parallel to the normal of the surface of the semiconductor substrate 10. Out of the surface of the first microlens 20-1 in the section shown in FIG. 3A, an angle formed by a tangent T1 in the outermost portion which contacts the first valley V1 and a plane P perpendicular to the normal is defined as a first angle G1. The section shown in FIG. 3B is a section which passes through the center of each of the third microlens 20-3 and the fourth microlens 20-4 adjacent to each other in the Y direction (second direction), and is parallel to the normal of the surface of the semiconductor substrate 10. Out of the surface of the third microlens 20-3 in the section shown in FIG. 3B, an angle formed by a tangent T2 in the outermost portion which contacts the second valley V2 and the plane P perpendicular to the normal is defined as a second angle G2. In this embodiment, G1≤G2 is satisfied.

As a simple example, if the surface of each microlens 20 is formed in a spherical shape to satisfy H1>H2, G1>G2 holds. As the first angle G1 increases, it becomes difficult to condense light traveling along an X-Z plane and entering the microlens 20 at the outermost portion (that is, in the vicinity of the first valley V1) to the photoelectric converter 12. To solve this, in this embodiment, the restriction of G1≤G2 is imposed, thereby efficiently condensing light traveling along the X-Z plane and entering the microlens 20 at the outermost portion to the photoelectric converter 12. That is, in this embodiment, the surface shape of each microlens 20 is defined to satisfy the restriction of G1≤G2, thereby efficiently condensing light traveling along the X-Z plane and entering the microlens 20 at the outermost portion to the photoelectric converter 12.

Note that it is more easier for light traveling along a Y-Z plane and entering the microlens 20 at the outermost portion to be condensed to the photoelectric converter 12 than light traveling along the X-Z plane and entering the microlens 20 at the outermost portion.

As described above, satisfying H1>H2 and G1≤G2 makes it possible to efficiently condense the light ray having the large incident angle to the photoelectric converter 12. This is advantageous in reducing shading in the direction along the long sides of the image sensing region 1.

Figure 4A:
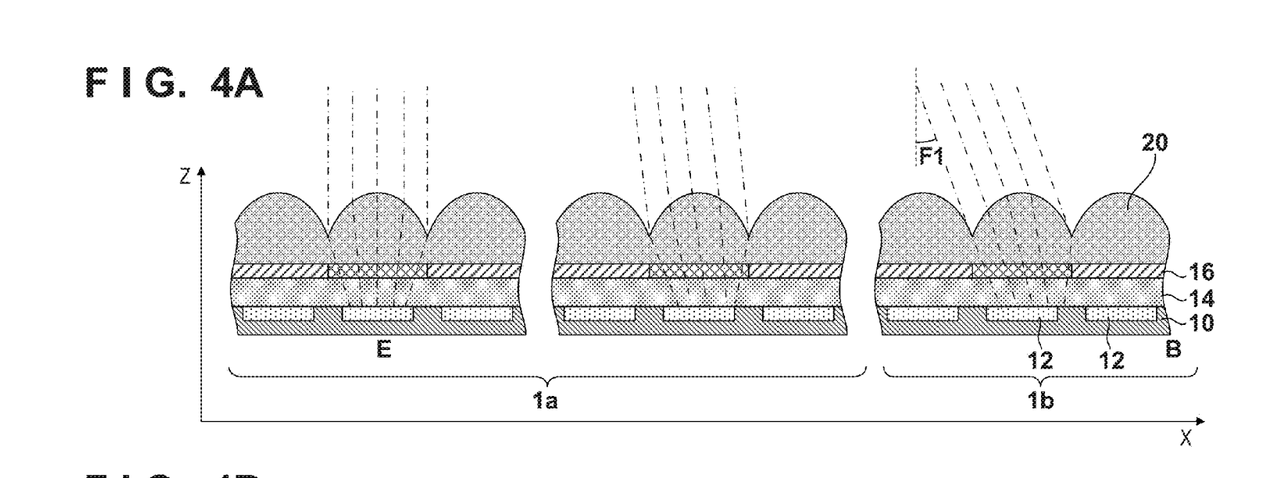
FIGS. 4A and 4B are sectional views showing the solid-state image sensor according to one embodiment of the present invention.
Figure 4B:
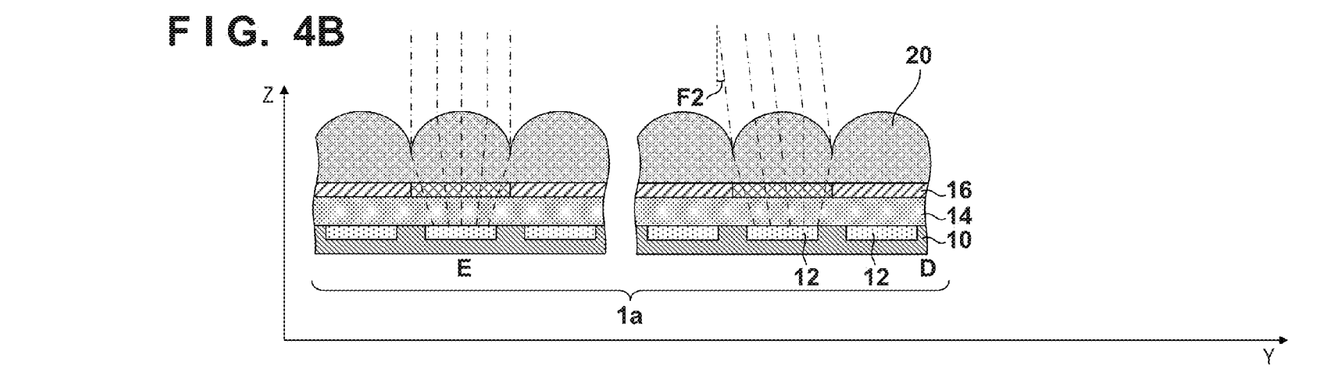

FIG. 4A schematically shows a sectional structure in a E-B line along the X direction in FIG. 1. FIG. 4B schematically shows a sectional structure in a E-D line along the Y direction in FIG. 1. In FIGS. 4A and 4B, light rays are indicated by alternate long and short dashed lines. By satisfying H1>H2 and G1 G2, the light ray having the incident angle G1 which is larger than the incident angle F2 as well as the light ray having the incident angle F2 enter the photoelectric converter 12 efficiently.

Figure 8A:
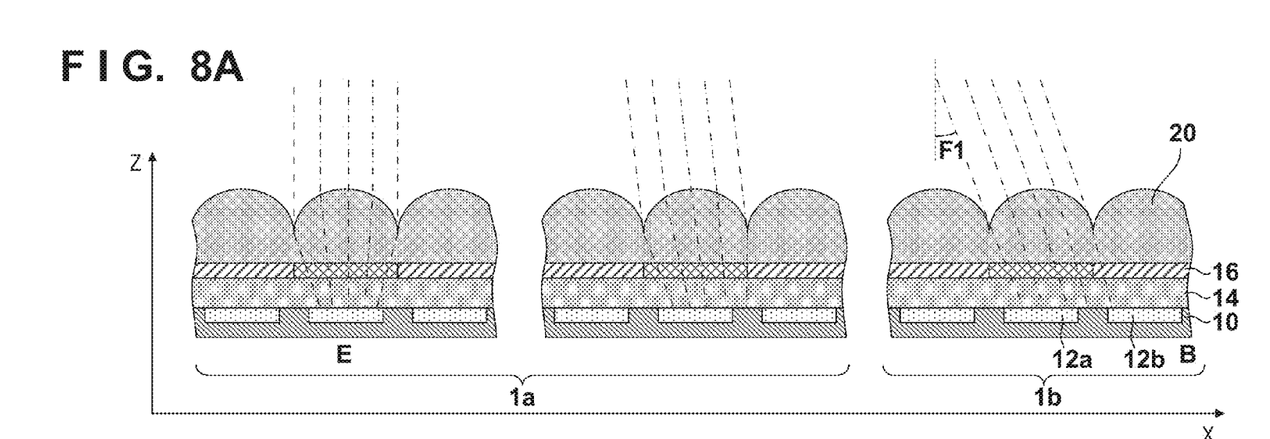
FIGS. 8A and 8B are views showing a comparative example.
Figure 8B:
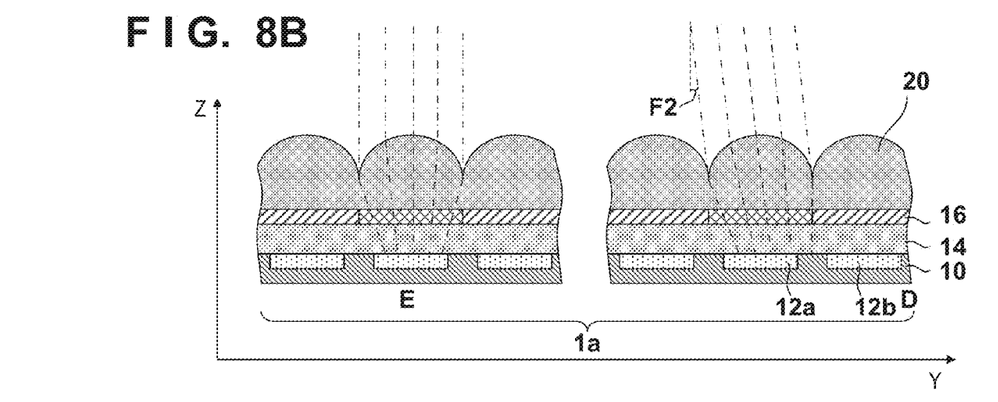

FIGS. 8A and 8B schematically show a comparative example to the above-described embodiment. Although FIG. 8A corresponds to the sectional structure in the E-B line along the X direction in FIG. 1, H1=H2 and G1=G2 hold. Although FIG. 8B corresponds to the sectional structure in the E-D line along the Y direction in FIG. 1, H1=H2 and G1=G2 hold. In a pixel at the position of B, one of the light rays which should enter a photoelectric converter 12a enters a photoelectric converter 12b. This reduces the sensitivity of a pixel including the photoelectric converter 12a, thereby causing shading and a color mixture.

Figure 5A:
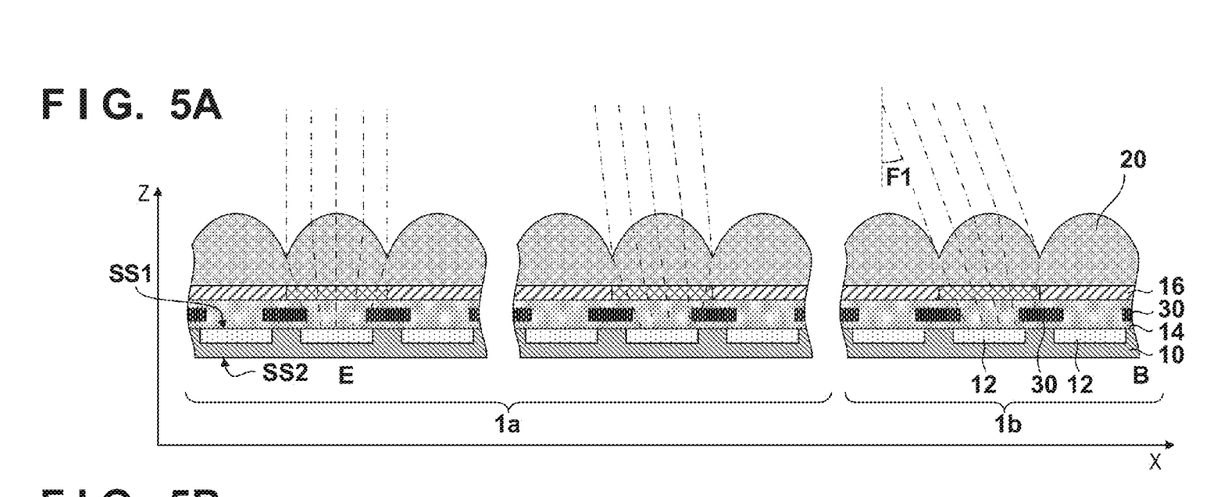
FIGS. 5A and 5B are sectional views showing a solid-state image sensor according to another embodiment of the present invention.
Figure 5B:
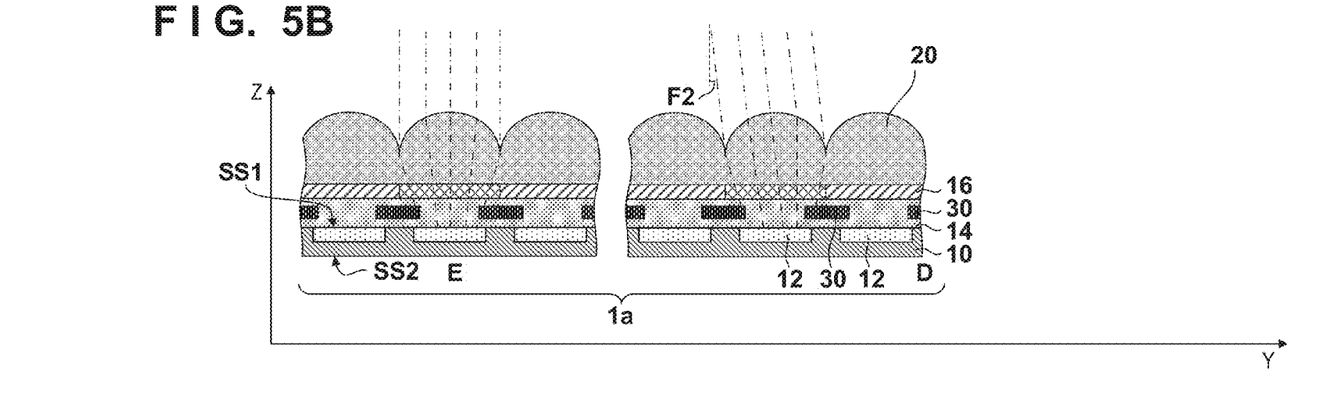

FIGS. 5A and 5B show a solid-state image sensor according to another embodiment of the present invention. In the solid-state image sensor according to the other embodiment, a plurality of microlenses 20 are arranged on the side of a first surface SS1 of a semiconductor substrate 10, and a wiring structure including conductive patterns 30 such as metal patterns is arranged between the first surface SS1 of the semiconductor substrate 10 and the microlenses 20. Such solid-state image sensor can be referred to as a front illumination solid-state image sensor. The wiring structure is not generally arranged on the second surface of the semiconductor substrate 10. Each conductive pattern 30 can include a light blocking pattern (light blocking member) for preventing a color mixture between pixels.

Figure 9A:
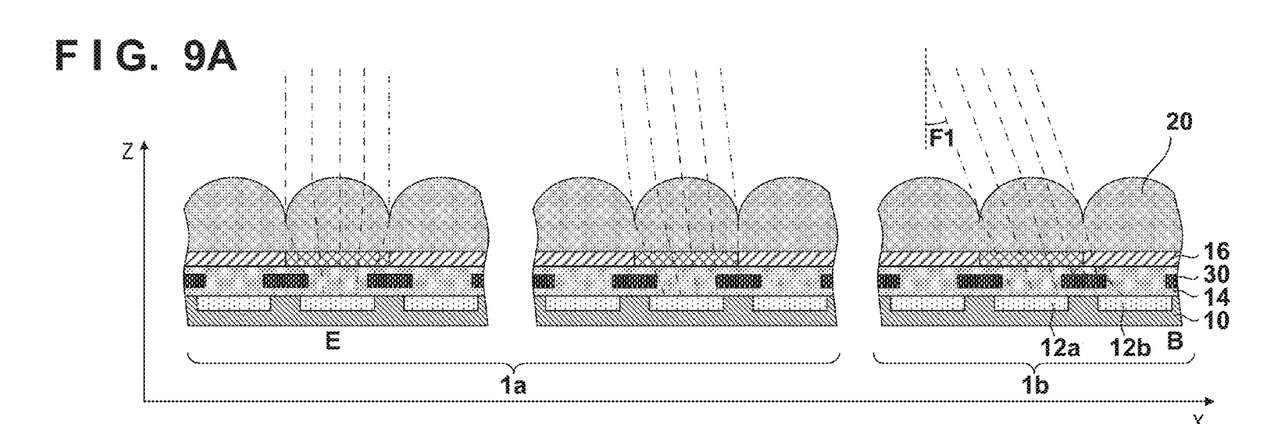
FIGS. 9A and 9B are views showing a comparative example.
Figure 9B:
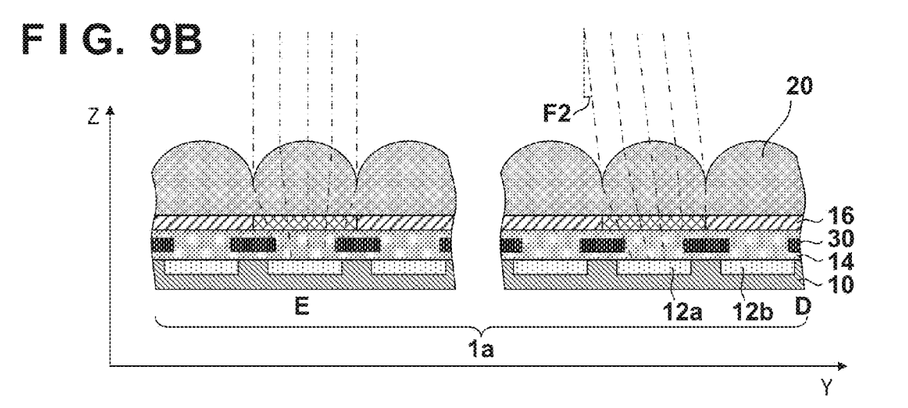

FIGS. 9A and 9B schematically show a comparative example to the above-described other embodiment. Although FIG. 9A corresponds to a sectional structure in a E-B line along an X direction in FIG. 1, H1=H2 and G1=G2 hold. Although FIG. 9B corresponds to a sectional structure in a E-D line along a Y direction in FIG. 1, H1=H2 and G1=G2 hold. In the pixel at the position of B, some of light rays which should enter a photoelectric converter 12a are reflected by the conductive pattern 30 and, for example, an interface between an insulating layer 14 and a color filter layer 16, and enter a neighboring photoelectric converter 12b. This reduces the sensitivity of the pixel including the photoelectric converter 12a, thereby causing shading and the color mixture.

Figure 6:
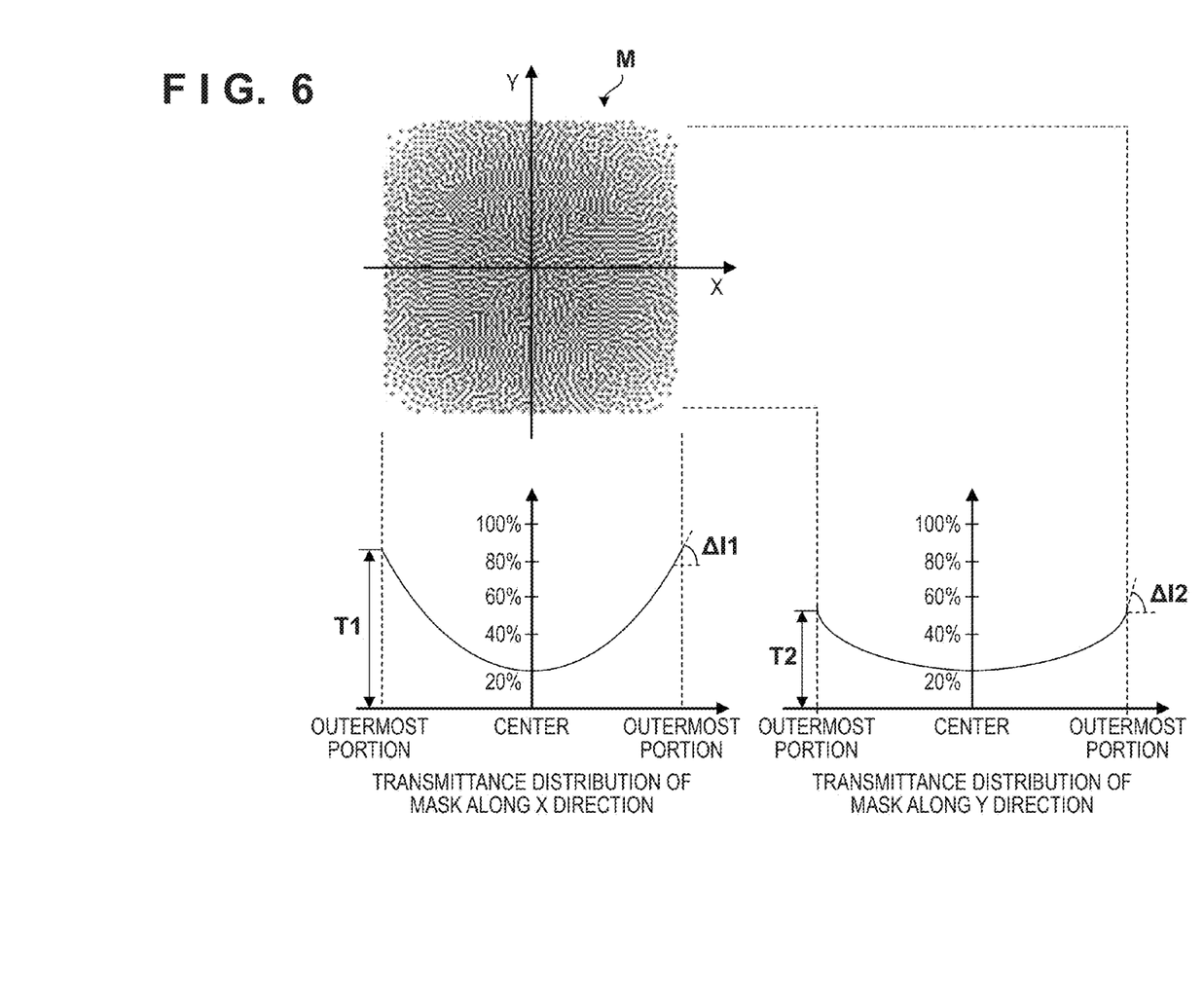
FIG. 6 shows views for explaining an embodiment of a method of manufacturing a solid-state image sensor.

An embodiment of a method of manufacturing the solid-state image sensor will be described below with reference to FIG. 6 and FIGS. 7A to 7C. In this manufacturing method, a photolithography process using masks, for example, grayscale masks each having a transmittance distribution is employed to form the microlenses 20. FIG. 6 illustrates a grayscale mask M corresponding to one microlens. Note that in practice, a grayscale mask in which the grayscale masks M as illustrated in FIG. 6 are arrayed two-dimensionally is used. FIG. 6 illustrates the transmittance distribution of the grayscale mask M along the X direction.

The transmittance of a portion corresponding to the microlens 20 at the outermost portion in a transmittance distribution along the long-side direction, that is, the X direction (first direction) of the image sensing region 1 is defined as T1. On the other hand, the transmittance of a portion corresponding to the microlens 20 at the outermost portion in the transmittance distribution along the short-side direction, that is, the Y direction (second direction) of the image sensing region 1 is defined as T2. Under these definitions, T1>T2 holds, thereby establishing H1>H2 in this embodiment.

The tilt of the portion corresponding to the microlens 20 at the outermost portion in the transmittance distribution along the long-side direction, that is, the X direction (first direction) of the image sensing region 1 is defined as ΔI1. On the other hand, the tilt of the portion corresponding to the microlens 20 at the outermost portion in the transmittance distribution along the short-side direction, that is, the Y direction (second direction) of the image sensing region 1 is defined as ΔI2. Under these definitions, ΔI1≤ΔI2 holds, thereby establishing G1≤G2 in this embodiment.

Figure 7A:
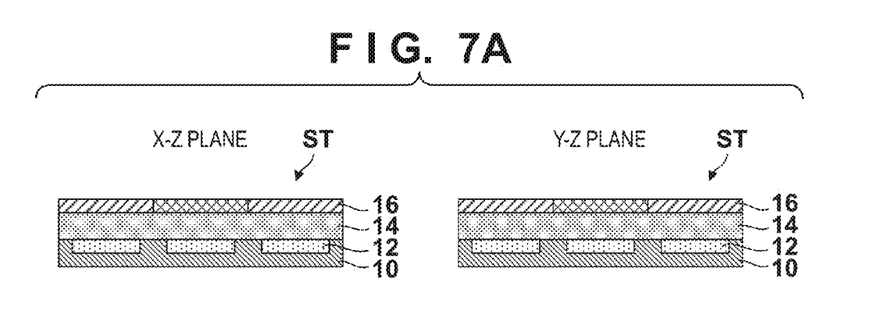
FIGS. 7A to 7C are views for explaining an embodiment of the method of manufacturing the solid-state image sensor.

The procedure of a method of manufacturing the solid-state image sensor will be exemplarily described below with reference to FIGS. 7A to 7C. First, in a step shown in FIG. 7A, the semiconductor substrate 10 including photoelectric converters 12, and a structure ST having the insulating layer 14 and the color filter layer 16 are prepared. Although not shown here, the structure ST further includes a transistor and a wiring structure.

Figure 7B:
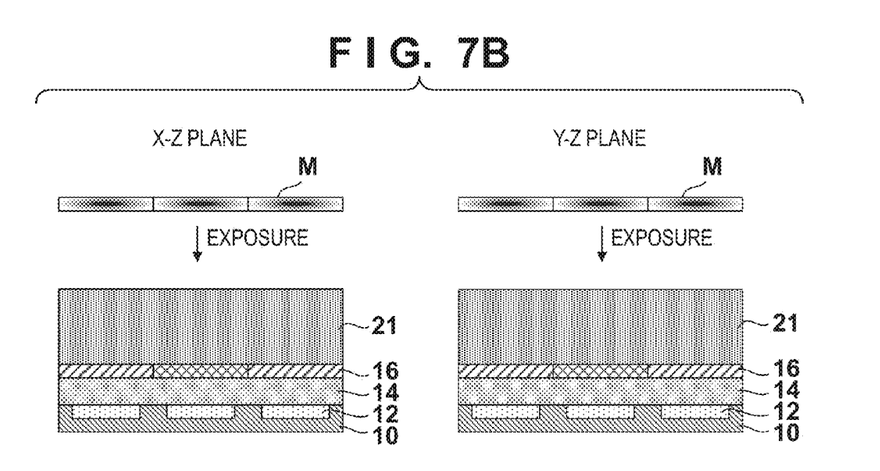

In a step shown in FIG. 7B, a photoresist film 21 is formed on a surface where the microlenses 20 in the structure ST should be formed, and an expose device exposes the photoresist film 21 using the grayscale mask M. The photoresist film 21 can be formed using a photoresist insensitive to exposure light (a photoresist whose γ curve is gentle).

Figure 7C:
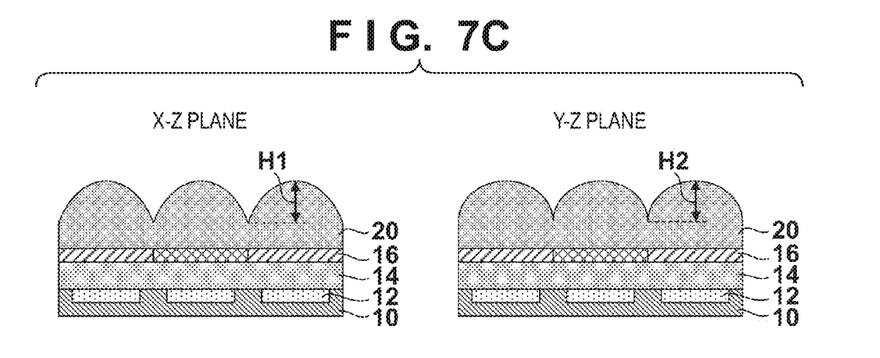

Then, in a step shown in FIG. 7C, the exposed photoresist film 21 is developed, thereby forming the microlenses 20 each having a thickness distribution (that is, a shape) corresponding to an exposure amount distribution. The refractive index of each microlens 20 is, for example, 1.6.

Thereafter, the developed photoresist film 21 is cured by heat treatment. In this treatment, the photoresist film 21 may have a small flowability, and it may flatten a shape of the photoresist film 21 such that the first angle G1 and the second angle G2 are changed to be smaller. The degree of the change depends on a type of the photoresist, and depends on the first angle G1 and the second angle G2 after the development. As a result, there may be a case in which G1≤G2 is not satisfied after the development and before the heat treatment, but G1≤G2 is satisfied after the heat treatment. In other words, even if ΔI1≤ΔI2 is not satisfied in the design of the grayscale mask, there may be a case in which microlenses are formed so as to satisfy H1>H2 and G1 G2.

Examples will be described below.

EXAMPLE 1

A solid-state image sensor according to Example 1 is the back illumination solid-state image sensor as illustrated in FIGS. 3A, 3B, 4A, and 4B. More specifically, the solid-state image sensor according to Example 1 is a 1/2.3 back illumination CMOS sensor, and the length of the long side of an image sensing region 1 is 5.9 mm and the length of the short side is 4.4 mm. Each pixel including a photoelectric converter 12 has a square shape of 1.6 μm×1.6 μm and the number of pixels is about 10,000,000. The photoelectric converter 12 is centered at the center of each pixel and has dimensions of 1.3 μm×1.3 μm. The total thickness of an insulating layer 14 and a color filter layer 16 is about 0.8 p.m. H1=about 0.45 μm, H2=about 0.37 μm, G1=about 43.2°, and G2=about 46.3° hold. The distance of an interface between the top of the microlens 20 and the color filter layer 16 serving as its underlying layer is 0.6 μm. The focal length of the microlens 20 according to Example 1 is set in consideration of the back illumination solid-state image sensor.

EXAMPLE 2

A solid-state image sensor according to Example 2 is the front illumination solid-state image sensor as illustrated in FIGS. 5A and 5B. More specifically, the solid-state image sensor according to Example 2 is a full-size front illumination CMOS sensor, and the length of the long side of an image sensing region 1 is 36 mm and the length of the short side is 24 mm. Each pixel including a photoelectric converter 12 has a square shape of 6 μm×6 μm and the number of pixels is about 24,000,000. The photoelectric converter 12 is centered at the center of each pixel and has dimensions of 4 μm×4 μm. The total thickness of an insulating layer 14 and a color filter layer 16 is about 4.5 μm. Conductive patterns 30 such as metal patterns are arranged between a semiconductor substrate 10 and microlenses 20. Each conductive pattern 30 includes a light blocking pattern (light blocking member). The lower surface of each light blocking pattern is positioned at a height of 0 μm from the surface of the photoelectric converter 12, and its line width is 0.8 μm and its thickness is 0.5 μm. The light blocking patterns are arranged to prevent a color mixture between the adjacent pixels. H1=about 1.20 μm, H2=about 0.98 μm, G1=about 36.7°, and G2=about 36.7° hold. The distance of an interface between the top of the microlens 20 and the color filter layer 16 serving as its underlying layer is about 1.6 μm. The focal length of the microlens 20 according to Example 2 is set in consideration of the front illumination solid-state image sensor.

[Others]

As an application of the solid-state image sensor according to the above-described embodiments, a camera in which the solid-state image sensor is assembled will be exemplarily explained below. The concept of the camera includes not only an apparatus mainly aiming at image capturing but also an apparatus (for example, a personal computer or a portable terminal) accessorily having an image capturing function. The camera includes the solid-state image sensor according to the present invention exemplified as the above-described embodiments, and a processing unit which processes a signal output from the solid-state image sensor. The processing unit can include, for example, an A/D converter and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-235388, filed Nov. 13, 2013, which is hereby incorporated by reference herein in its entirety.

What is claimed is:

1. A solid-state image sensor comprising a semiconductor substrate including a plurality of photoelectric converters arrayed to form an image sensing region of a rectangle having long sides and short sides, and a plurality of microlenses corresponding to the plurality of photoelectric converters,
    wherein first height differences between tops of a first group of microlenses, of the plurality of microlenses, which are arranged in a first direction parallel to the long sides, and valleys between the first group of microlenses are larger than second height differences between tops of a second group of microlenses, of the plurality of microlenses, which are arranged in a second direction parallel to the short sides, and valleys between the second group of microlenses, and
    wherein a first angle formed by a plane perpendicular to a normal of a surface of the semiconductor substrate and a tangent in an outermost portion of a surface of each of the first group of microlenses in a section passing through centers of the first group of microlenses and parallel to the normal is equal to or smaller than a second angle formed by the plane and a tangent in an outermost portion of a surface of each of the second group of microlenses in a section passing through centers of the second group of microlenses and parallel to the normal.

2. The sensor according to claim 1, wherein an arrangement pitch of the photoelectric converters in the first direction and that in the second direction are equal to each other.

3. The sensor according to claim 1, wherein the plurality of microlenses are arranged in contact with each other.

4. The sensor according to claim 1, wherein the semiconductor substrate has a first surface and a second surface, the plurality of microlenses are arranged on a side of the first surface of the semiconductor substrate, and a wiring structure is arranged on a side of the second surface of the semiconductor substrate.

5. The sensor according to claim 1, wherein a light blocking members are arranged between the semiconductor substrate and the first valley, and between the semiconductor substrate and the second valley.

6. A solid-state image sensor comprising a semiconductor substrate including a plurality of photoelectric converters arrayed to form an image sensing region of a rectangle having long sides and short sides, and a plurality of microlenses corresponding to the plurality of photoelectric converters, the plurality of microlenses including a first microlens, a second microlens, a third microlens, and a fourth microlens, the first microlens and the second microlens being arranged adjacent to each other in a first direction parallel to the long sides, the third microlens and the fourth microlens being arranged adjacent to each other in a second direction parallel to the short sides,
    wherein a first height difference between a first valley and a top of each of the first microlens and the second microlens is larger than a second height difference between a second valley and a top of each of the third microlens and the fourth microlens, the first valley being arranged between the first microlens and the second microlens the second valley being arranged between the third microlens and the fourth microlens,
    wherein a first angle formed by a plane perpendicular to a normal of a surface of the semiconductor substrate and a tangent in an outermost portion of a surface of the first microlens in a section passing through a center of each of the first microlens and the second microlens and parallel to the normal is equal to or smaller than a second angle formed by the plane and a tangent in an outermost portion of a surface of the third microlens in a section passing through a center of each of the third microlens and the fourth microlens and parallel to the normal, the outermost portion of the surface of the first microlens contacting the first valley and the outermost portion of the surface of the second microlens contacting the second valley, and
    wherein out of the plurality of microlenses, microlenses other than microlenses which form an outermost portion of an array made of the plurality of microlenses have the same shapes.

7. A solid-state image sensor comprising a semiconductor substrate including a plurality of photoelectric converters arrayed to form an image sensing region of a rectangle having long sides and short sides, and a plurality of microlenses corresponding to the plurality of photoelectric converters, the plurality of microlenses including a first microlens, a second microlens, a third microlens, and a fourth microlens, the first microlens and the second microlens being arranged adjacent to each other in a first direction parallel to the long sides, the third microlens and the fourth microlens being arranged adjacent to each other in a second direction parallel to the short sides,
    wherein a first height difference between a first valley and a top of each of the first microlens and the second microlens is larger than a second height difference between a second valley and a top of each of the third microlens and the fourth microlens, the first valley being arranged between the first microlens and the second microlens the second valley being arranged between the third microlens and the fourth microlens, wherein a first angle formed by a plane perpendicular to a normal of a surface of the semiconductor substrate and a tangent in an outermost portion of a surface of the first microlens in a section passing through a center of each of the first microlens and the second microlens and parallel to the normal is equal to or smaller than a second angle formed by the plane and a tangent in an outermost portion of a surface of the third microlens in a section passing through a center of each of the third microlens and the fourth microlens and parallel to the normal, the outermost portion of the surface of the first microlens contacting the first valley and the outermost portion of the surface of the second microlens contacting the second valley, and wherein a power of the first microlens in the first direction is larger than that in the second direction.

8. A camera comprising:

a solid-state image sensor comprising a semiconductor substrate including a plurality of photoelectric converters arrayed to form an image sensing region of a rectangle having long sides and short sides, and a plurality of microlenses corresponding to the plurality of photoelectric converters; and a processing unit configured to process a signal output from the solid-state image sensor, wherein first height differences between tops of a first group of microlenses, of the plurality of microlenses, which are arranged in a first direction parallel to the long sides, and valleys between the first group of microlenses are larger than second height differences between tops of a second group of microlenses, of the plurality of microlenses, which are arranged in a second direction parallel to the short sides, and valleys between the second group of microlenses, and wherein a first angle formed by a plane perpendicular to a normal of a surface of the semiconductor substrate and a tangent in an outermost portion of a surface of each of the first group of microlenses in a section passing through centers of the first group of microlenses and parallel to the normal is equal to or smaller than a second angle formed by the plane and a tangent in an outermost portion of a surface of each of the second group of microlenses in a section passing through centers of the second group of microlenses and parallel to the normal.

9. A method of manufacturing a solid-state image sensor, comprising a semiconductor substrate including a plurality of photoelectric converters arrayed to form an image sensing region of a rectangle having long sides and short sides, and a plurality of microlenses corresponding to the plurality of photoelectric converters, wherein first height differences between tops of a first group of microlenses, of the plurality of microlenses, which are arranged in a first direction parallel to the long sides, and valleys between the first group of microlenses are larger than second height differences between tops of a second group of microlenses, of the plurality of microlenses, which are arranged in a second direction parallel to the short sides, and valleys between the second group of microlenses, and wherein a first angle formed by a plane perpendicular to a normal of a surface of the semiconductor substrate and a tangent in an outermost portion of a surface of each of the first group of microlenses in a section passing through centers of the first group of microlenses and parallel to the normal is equal to or smaller than a second angle formed by the plane and a tangent in an outermost portion of a surface of each of the second group of microlenses in a section passing through centers of the second group of microlenses and parallel to the normal, the method comprising forming a photoresist film on the semiconductor substrate, exposing the photoresist film using a grayscale mask, and forming the plurality of microlenses by developing the exposed photoresist film.

10. A solid-state image sensor comprising a semiconductor substrate including a plurality of photoelectric converters arrayed to form an image sensing region of a rectangle having long sides and short sides, and a plurality of microlenses corresponding to the plurality of photoelectric converters, wherein a power of each of the plurality of microlenses in a direction parallel to the long sides is larger than a power of each of the plurality of microlenses in a direction parallel to the short sides.

* * * * *